US009825386B2

(12) United States Patent
Lee et al.

(10) Patent No.: US 9,825,386 B2
(45) Date of Patent: Nov. 21, 2017

(54) BOARD TO BOARD MALE CONNECTOR AND BOARD TO BOARD FEMALE CONNECTOR

(71) Applicant: ADVANCED-CONNECTEK INC., New Taipei (TW)

(72) Inventors: Kuo-Ching Lee, New Taipei (TW); Jin Wei Wang, New Taipei (TW); Mei Shi, New Taipei (TW); Sheng-Ho Yang, New Taipei (TW); Wang-Jie Luo, New Taipei (TW); Ta-Teh Meng, New Taipei (TW)

(73) Assignee: ADVANCED-CONNECTEK INC., New Taipai (TW)

( * ) Notice: Subject to any disclaimer, the term of this patent is extended or adjusted under 35 U.S.C. 154(b) by 0 days.

(21) Appl. No.: 15/225,812

(22) Filed: Aug. 1, 2016

(65) Prior Publication Data

US 2017/0040720 A1 Feb. 9, 2017

(30) Foreign Application Priority Data

Aug. 4, 2015 (CN) .......................... 2015 1 0469986

(51) Int. Cl.

| | |
|---|---|
| ***H01R 12/00*** | (2006.01) |
| ***H05K 1/00*** | (2006.01) |
| ***H01R 12/73*** | (2011.01) |
| ***H01R 12/70*** | (2011.01) |
| ***H01R 12/71*** | (2011.01) |
| *H01R 13/20* | (2006.01) |
| *H01R 13/03* | (2006.01) |

(52) U.S. Cl.
CPC ......... *H01R 12/73* (2013.01); *H01R 12/7029* (2013.01); *H01R 12/716* (2013.01); *H01R 12/707* (2013.01); *H01R 13/03* (2013.01); *H01R 13/20* (2013.01)

(58) Field of Classification Search
CPC ....... H01R 12/52; H01R 12/716; H01R 9/096
USPC .......................................... 439/74, 495, 660
See application file for complete search history.

(56) References Cited

U.S. PATENT DOCUMENTS 8,845,339 B2 * 9/2014 Ono ..................... H01R 12/712 439/74
2008/0207014 A1 * 8/2008 Takeuchi ........... H01R 13/6275 439/74
2011/0045679 A1 * 2/2011 Yu ........................ H01R 12/716 439/66
2013/0012039 A1 * 1/2013 Nose .................... H01R 12/716 439/74

(Continued)

*Primary Examiner* — Abdullah Riyami
*Assistant Examiner* — Thang Nguyen
(74) *Attorney, Agent, or Firm* — Winston Hsu

(57) ABSTRACT

A board to board male connector includes a male insulator, a first male signal contact set, a second male signal contact set, and a first male holding contact. The male insulator includes a first side wall, a second side wall, a first erect wall, and second erect wall. The first side wall is opposite to the second side wall. The first erect wall is opposite to the second erect wall. The first male signal contact set is disposed on the first erect wall. The second male signal contact set is disposed on the second erect wall. The first male holding contact includes a first male holding body disposed on the first side wall, and at least one first embedding wing extending from at least one side of the first male holding body and embedding into the first side wall.

20 Claims, 10 Drawing Sheets

(56) References Cited

U.S. PATENT DOCUMENTS

2013/0330943 A1* 12/2013 Sasaki .................. H01R 13/631
439/74
2015/0079816 A1* 3/2015 Suzuki ................. H01R 12/716
439/74
2015/0140841 A1* 5/2015 Watanabe .......... H01R 12/7011
439/74
2015/0207248 A1* 7/2015 Takenaga ............. H01R 12/716
439/74

* cited by examiner

BOARD TO BOARD MALE CONNECTOR AND BOARD TO BOARD FEMALE CONNECTOR

BACKGROUND OF THE INVENTION

1. Field of the Invention

The present invention relates to a male connector and a female connector, and more particularly, to a board to board male connector and a board to board female connector capable of enduring large current.

2. Description of the Prior Art

A board to board connector assembly enables signal transmission via engagement of a male signal contact and a female signal contact. In other words, the female contact of the board to board connector assembly is merely utilized for clamping the male signal contact, so as to fix the board to board male connector and the board to board female connector. However, when the board to board male connector or the board to board female connector is suddenly applied by an external force, the board to board male connector may disengage from the board to board female connector easily due to an insufficient clamping strength between the board to board male connector and the board to board female connector, which causes signal interruption or damage of the signal contacts.

SUMMARY OF THE INVENTION

Therefore, an objective of the present invention is to provide a board to board male connector and a board to board female connector having holding contacts for solving aforementioned drawbacks.

In order to achieve the aforementioned objective, the present invention discloses a board to board male connector. The male connector includes a male insulator, a first male signal contact, a second male signal contact, and a first male holding contact. The male insulator includes a first side wall, a second side wall, a first erect wall, and a second erect wall. The first side wall is opposite to the second side wall, and the first erect wall is opposite to the second erect wall. The first male signal contact set is disposed on the first erect wall. The second male signal contact set is disposed on the second erect wall. The first male holding contact includes a first male holding body and at least one first embedding wing. The first male holding body is disposed on the first side wall. The at least one first embedding wing extends from at least one side of the first male holding body and embeds into the first side wall.

In order to achieve the aforementioned objective, the present invention further discloses a board to board female connector. The female connector includes a female insulator, a first female signal contact set, a second female contact set, and a first female holding contact. The female insulator includes an inner lateral wall, a first outer lateral wall, a second outer lateral wall, a first outer straight wall, and a second outer straight wall. A first slot is defined between the inner lateral wall and the first outer lateral wall. A second slot is defined between the inner lateral wall and the second outer lateral wall. A first recess is defined between the inner lateral wall and the first outer straight wall, and a second recess is defined between the inner lateral wall and the second outer straight wall. The first female signal contact set is disposed in the first recess. The second female signal contact set is disposed in the second recess. The first female holding contact includes a first female holding body and at least one first embedding claw. The first female holding body is disposed on the first outer lateral wall. The at least one first embedding claw includes a first extending portion, a first bending portion, and a first claw portion. The first extending portion extends from a side of the first female holding body. The first bending portion extends from the first extending portion. The first claw portion protrudes from the first bending portion. The first extending portion and the first bending portion clamp the first outer lateral wall, and the first claw portion embeds into the first outer lateral wall.

In summary, in the present invention, the first male holding contact of the male connector is fixed on the male insulator by the first embedding wing, and the first female holding contact of the second female connector is fixed on the female insulator by the first embedding claw. Therefore, the first male holding contact and the first female holding contact are able to respectively provide the male insulator and the female insulator with an additional holding force, so as to increasing a mating force between the male connector and the female connector.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
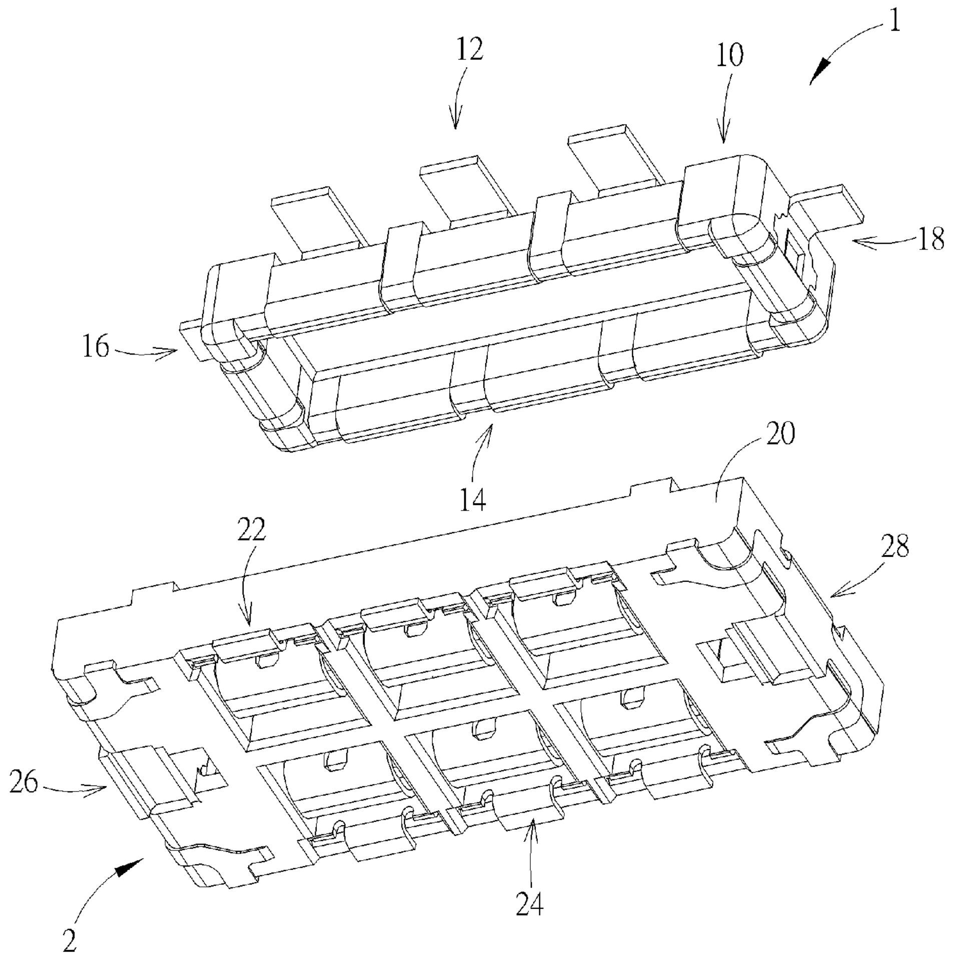
FIG. 1 and FIG. 2 are schematic diagrams of a male connector and a female connector at different views according to an embodiment of the present invention.
Figure 2:
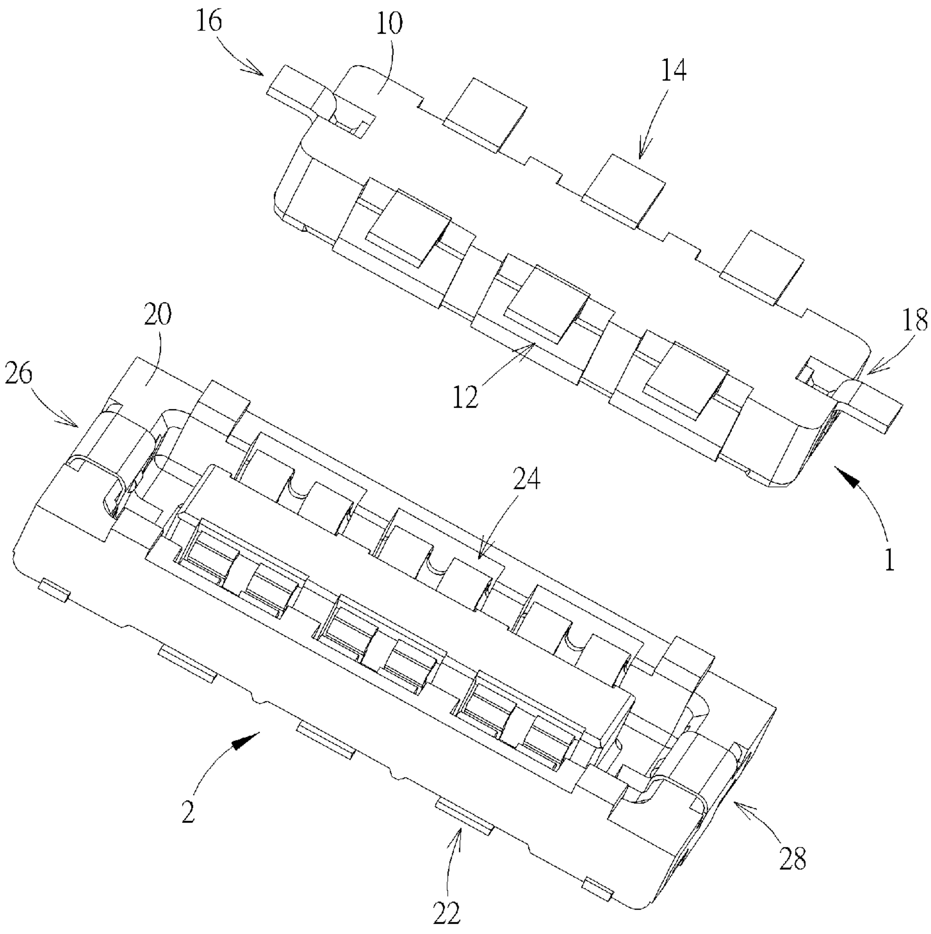
Figure 3:
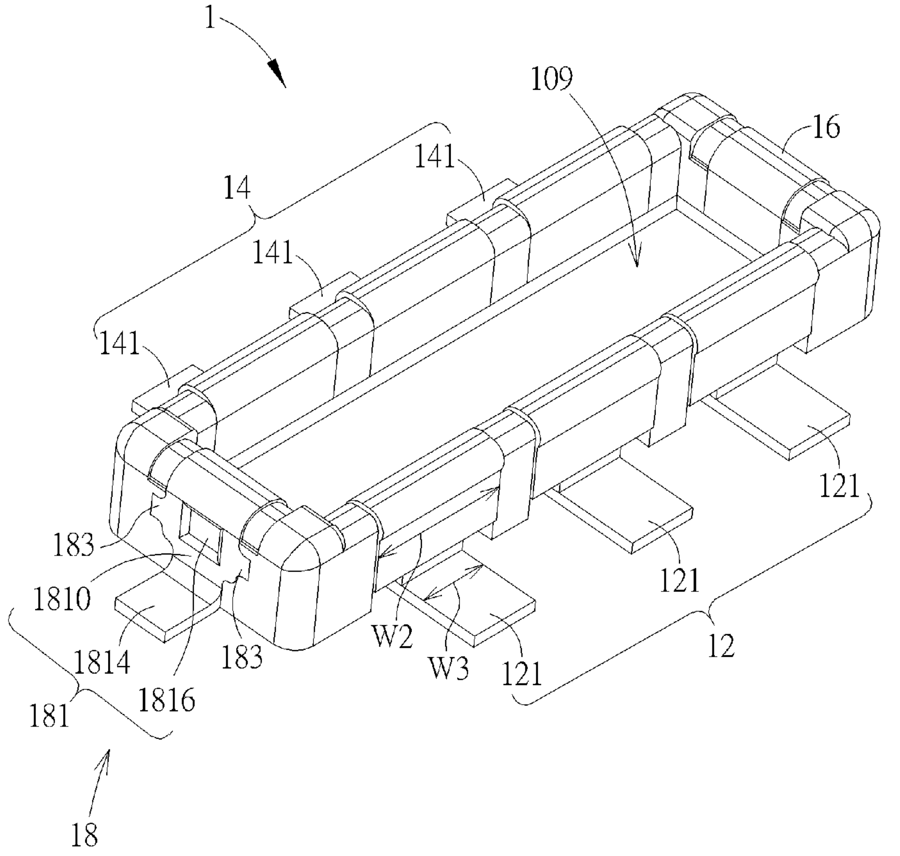
FIG. 3 is a schematic diagram of the male connector according to the embodiment of the present invention.
Figure 4:
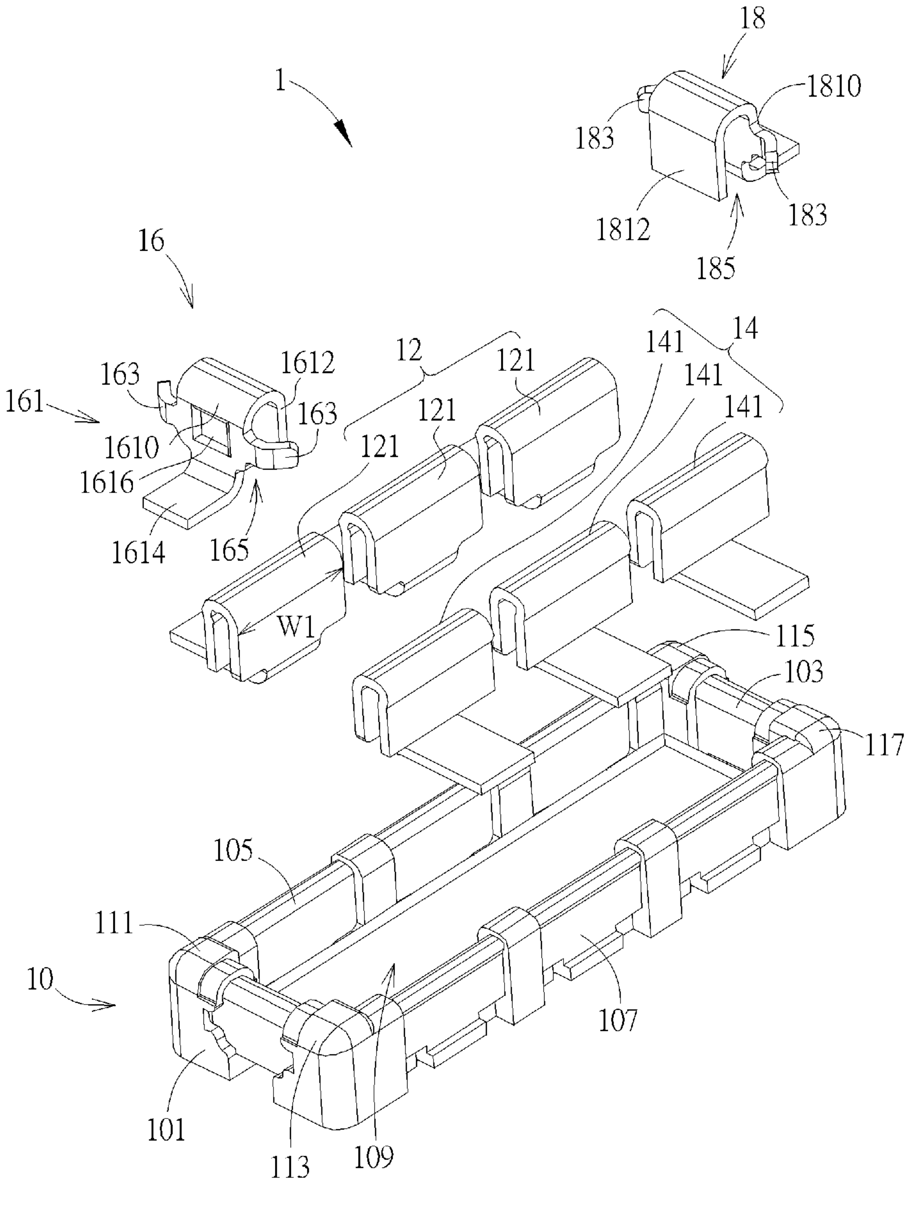
FIG. 4 is an exploded diagram of the male connector according to the embodiment of the present invention.

Please refer to FIG. 1 to FIG. 4. FIG. 1 and FIG. 2 are schematic diagrams of a male connector 1 and a female connector 2 at different views according to an embodiment of the present invention. FIG. 3 is a schematic diagram of the male connector 1 according to the embodiment of the present invention. FIG. 4 is an exploded diagram of the male connector 1 according to the embodiment of the present invention. As shown in FIG. 1 to FIG. 4, the male connector 1 includes a male insulator 10, a first male signal contact set 12, a second male signal contact set 14, a first male holding contact 16, and a second male holding contact 18. The male insulator 10 includes a first side wall 101, a second side wall 103, a first erect wall 105, and a second erect wall 107. The first side wall 101 is opposite to the second side wall 103. The first erect wall 105 is opposite to the second erect wall 107. The first side wall 101, the first erect wall 105, the second side wall 103, and the second erect wall 107 communicate with one another and cooperatively define a male mating space 109 for mating the female connector 2.

Furthermore, a first male guiding block 111 is disposed at a conjunction where the first side wall 101 and the first erect wall 105 are connected. A second male guiding block 113 is disposed at a conjunction where the first side wall 101 and the second erect wall 107 are connected. A third male guiding block 115 is disposed at a conjunction where the second side wall 103 and the first erect wall 105 are connected, and a fourth male guiding block 117 is disposed at a conjunction where the second side wall 103 and the second erect wall 107 are connected. The first male guiding block 111, the second male guiding block 113, the third male guiding block 115, and the fourth male guiding block 117 are for guiding the male connector 1 to be aligned with the female connector 2 during the male connector 1 is mated with the female connector 2.

Figure 5:
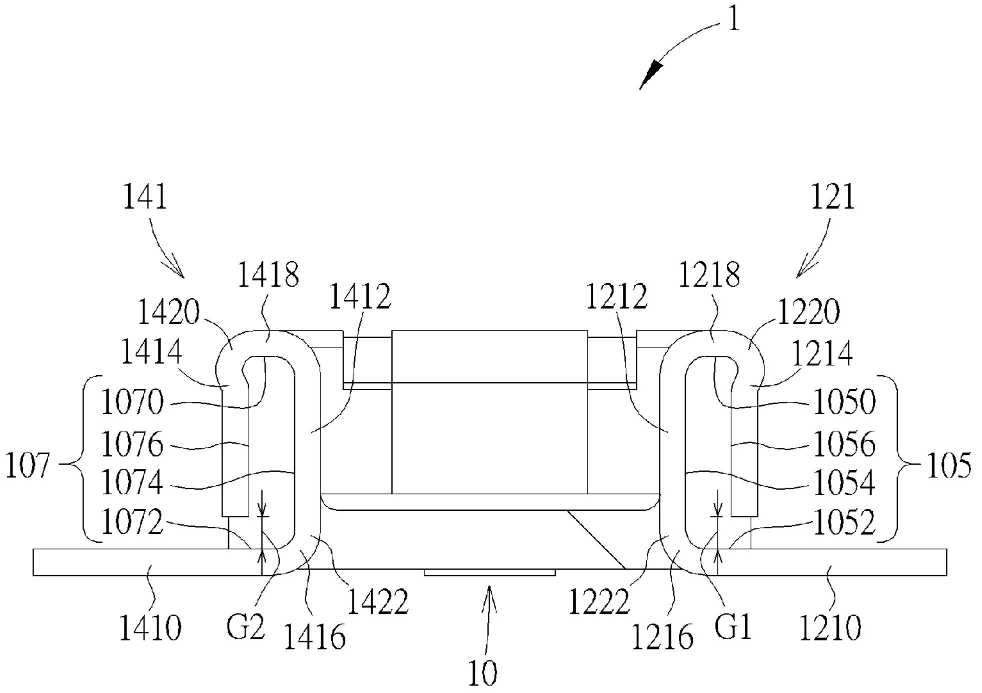
FIG. 5 is a sectional diagram of the male connector according to the embodiment of the present invention.

Please refer to FIG. 3 to FIG. 5. FIG. 5 is a sectional diagram of the male connector 1 according to the embodiment of the present invention. As shown in FIG. 3 to FIG. 5, the first male signal contact set 12 includes three first male signal contacts 121 disposed on the first erect wall 105. It should be noticed that the quantity of the first male signal contact 121 is not limited thereto. Furthermore, the first erect wall 105 has a first upper side 1050, a first lower side 1052, a first inner side 1054, and a first outer side 1056. The second erect wall 107 has a second upper side 1070, a second lower side 1072, a second inner side 1074, and a second outer side 1076. The first lower side 1052 and the second lower side 1072 face a circuit board, which is not shown in figures. The first inner side 1054 faces the second inner side 1074.

Each of the first male signal contacts 121 includes a first male welding portion 1210, a first male inner abutting portion 1212, a first male outer abutting portion 1214, a first male lower connecting portion 1216, a first male upper connecting portion 1218, and a first male bending portion 1220. The first male welding portion 1210 is welded on the circuit board. The first male lower connecting portion 1216 is connected to the first male welding portion 1210 and the first male inner abutting portion 1212, so that the first male inner abutting portion 1212 extends from the first male welding portion 1210 and is combined with the first inner side 1054. The first male outer abutting portion 1214 extends from the first male inner abutting portion 1212 and is combined with the first outer side 1056. The first male upper connecting portion 1218 extends from the first male inner abutting portion 1212 and is combined with the first upper side 1050. The first male bending portion 1220 is connected to the first male upper connecting portion 1218 and the first male outer abutting portion 1214, so that the first male outer abutting portion 1214 extends from the first male inner abutting portion 1212 and is combined with the first outer side 1056.

A gap G1 is formed between an edge of the first male outer abutting portion 1214 and an upper surface of the first male welding portion 1210, i.e., the edge of the first male outer abutting portion 1214 is not connected to the upper surface of the first male welding portion 1210. Therefore, it prevents solder from climbing up on the first male outer abutting portion 1214 via the first male welding portion 1210 during a Surface Mount Technology (SMT) process. Furthermore, the first male lower connecting portion 1216 has an exposed Nickel-plated layer 1222. Since solder cannot climb up on the exposed Nickel-plated layer 1222, the exposed Nickel-plated layer 1222 prevents solder from climbing up on the first male inner abutting portion 1212 via the first male welding portion 1210 during a Surface Mount Technology (SMT) process. Therefore, the gap G1 and the exposed Nickel-plated layer 1222 prevent a climbing effect of solder during a Surface Mount Technology (SMT) process. In a practical application, the Nickel-plated layer 1222 of the first male lower connecting portion 1216 can be exposed by stripping a gold layer over the Nickel-plated layer 1222 via a gold stripping process.

As shown in FIG. 4, there is a width difference between the first male outer abutting portion 1214 and the first male welding portion 1210, i.e., a width W1 of the first male inner abutting portion 1212 and a width W2 of the first male outer abutting portion 1214 are greater than a width W3 of the first male welding portion 1210. Therefore, a contacting area between the first male inner abutting portion 1212 and the female connector 2 or a contacting area between the first male outer abutting portion 1214 and the female connector 2 can be increased, so as to reduce impedance between the first male signal contact 121 and the female connector 2, which allows the first male signal contact 121 to endure a larger current. Furthermore, the first male bending portion 1220 can be a mushroom-shaped structure. In other words, the first male bending portion 1220 can be an arc-shaped structure and protrude from the first male outer abutting portion 1214 along a direction from the first male inner abutting portion 1212 toward the first male outer abutting portion 1214 for increasing an insertion and withdrawal force between the first male signal contact 121 and the female connector 2. Besides, since the first male signal contact 121 is a structure bent from the first inner side 1054 toward the first outer side 1056, a climbing length of solder is longer during a Surface Mount Technology (SMT) process of the first male welding portion 1210, which effectively prevents the first male signal contact 121 from the climbing effect of solder.

Similarly, the second male signal contact set 14 includes three second male signal contacts 141 disposed on the second erect wall 107. It should be noticed that the quantity of the second male signal contact 141 is not limited thereto. Furthermore, each of the second male signal contacts 141 includes a second male welding portion 1410, a second male inner abutting portion 1412, a second male outer abutting portion 1414, a second male lower connecting portion 1416, a second male upper connecting portion 1418, and a second male bending portion 1420. A gap G2 is formed between an edge of the second male outer abutting portion 1414 and an upper surface of the second male welding portion 1410, i.e., the edge of the second male outer abutting portion 1414 is not connected to the upper surface of the second male welding portion 1410. The second male lower connecting portion 1416 has an exposed Nickel-plated layer 1422. Structures of the second male welding portion 1410, the second male inner abutting portion 1412, the second male outer abutting portion 1414, the second male lower connecting portion 1416, the second male upper connecting portion 1418, and the second male bending portion 1420 are similar to structures of the first male welding portion 1210, the first male inner abutting portion 1212, the first male outer abutting portion 1214, the first male lower connecting portion 1216, the first male upper connecting portion 1218, and the first male bending portion 1220, and descriptions are omitted herein for simplicity.

As shown in FIG. 3 and FIG. 4, the first male holding contact 16 includes a first male holding body 161 and two first embedding wings 163. The first male holding body 161 is disposed on the first side wall 101. The two first embedding wings 163 extend from two sides of the first male holding body 161. Furthermore, the first male holding body 161 includes a first base 1610, a first engaging plate 1612, and a first holding welding portion 1614. The first engaging plate 1612 extends from the first base 1610. A first engaging slot 165 is defined between the first engaging plate 1612 and the first base 1610 and for engaging with the first side wall 101. The first holding welding portion 1614 extends from the first base 1610 and is welded on the circuit board. The two first embedding wings 163 embed into the first side wall 101, so that the first male holding contact 16 can be firmly combined with the first side wall 101 by the two first embedding wings 163 and the first engaging slot 165, which improves a holding effect between the first male holding contact 16 and the male insulator 10. Furthermore, the first base 1610 includes a first male engaging structure 1616. In this embodiment, the first male engaging structure 1616 can be an engaging slot structure. However, it is not limited to this embodiment.

Similarly, the second male holding contact 18 includes a second male holding body 181 and two second embedding wings 183. The second male holding body 181 is disposed on the second side wall 103. The two second embedding wings 183 extend from two sides of the second male holding body 181. The second male holding body 181 includes a second base 1810, a second engaging plate 1812, and a second holding welding portion 1814. The second engaging plate 1812 extends from the second base 1810. A second engaging slot 185 is defined between the second engaging plate 1812 and the second base 1810 and for engaging with the second side wall 103. The second holding welding portion 1814 extends from the second base 1810 and is welded on the circuit board. The two second embedding wings 183 embed into the second side wall 103, so that the second male holding contact 18 can be firmly combined with the second side wall 103 by the two second embedding wings 183 and the second engaging slot 185, which improves a holding effect between the second male holding contact 18 and the male insulator 10. Furthermore, the second base 1810 includes a second male engaging structure 1816. In this embodiment, the second male engaging structure 1816 can be an engaging slot structure. However, it is not limited to this embodiment.

Figure 6:
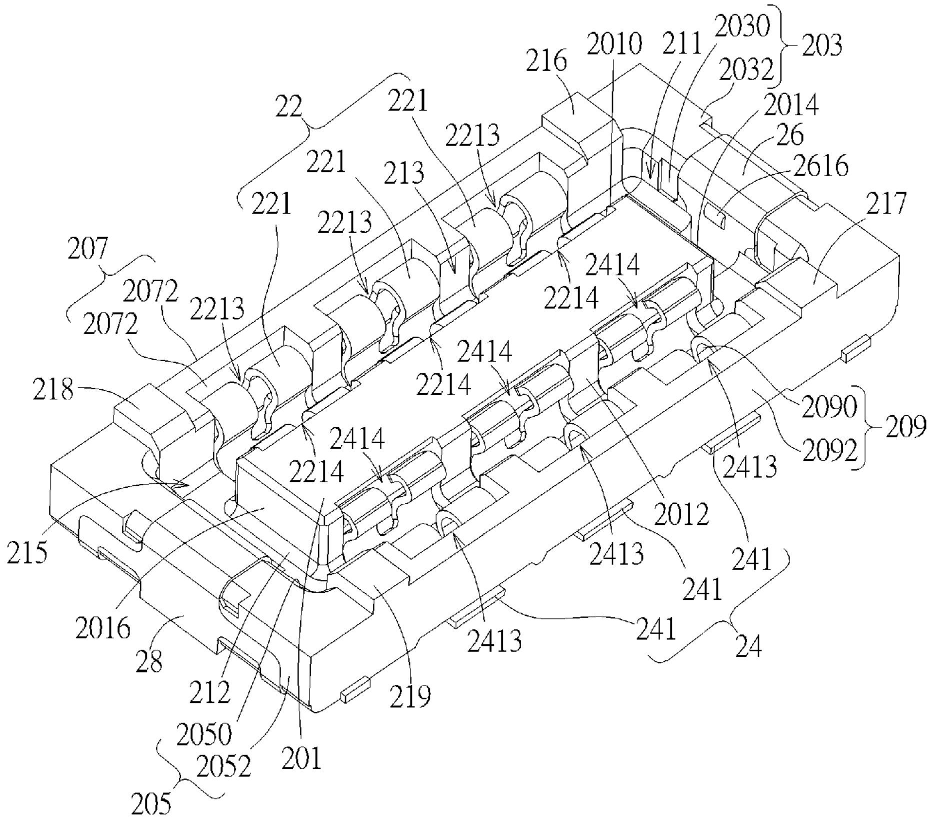
FIG. 6 is a schematic diagram of the female connector according to the embodiment of the present invention.
Figure 7:
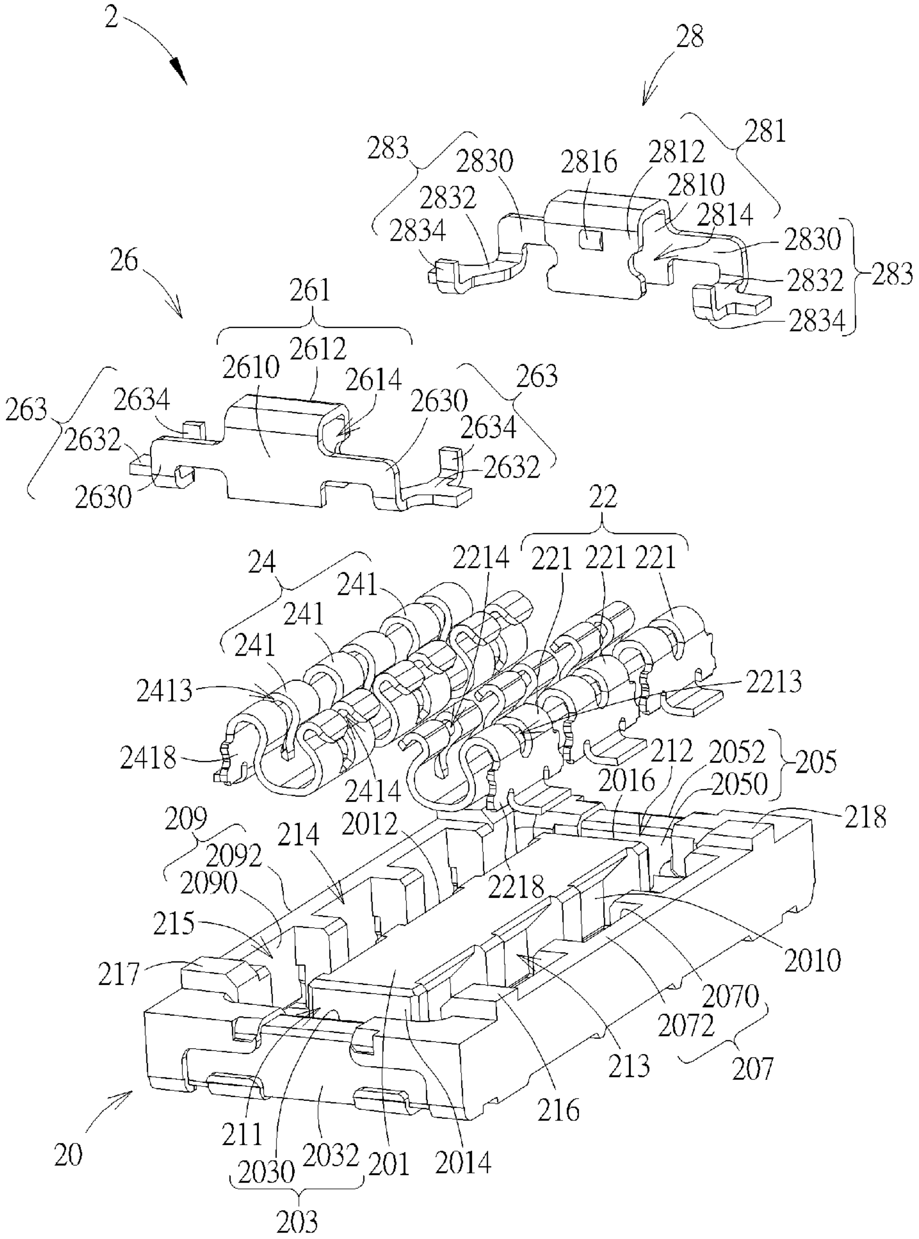
FIG. 7 is an exploded diagram of the female connector according to the embodiment of the present invention.

Please refer to FIG. 1, FIG. 2, FIG. 6, and FIG. 7. FIG. 6 is a schematic diagram of the female connector 2 according to the embodiment of the present invention. FIG. 7 is an exploded diagram of the female connector 2 according to the embodiment of the present invention. As shown in FIG. 1, FIG. 2, FIG. 6, and FIG. 7, the female connector 2 includes a female insulator 20, a first female signal contact set 22, a second female signal contact set 24, a first female holding contact 26, and a second female holding contact 28. The female insulator 20 includes an inner lateral wall 201, a first outer lateral wall 203, a second outer lateral wall 205, a first outer straight wall 207, and a second outer straight wall 209. A first slot 211 is defined between the inner lateral wall 201 and the first outer lateral wall 203 and corresponding to the first side wall 101 of the male insulator 10. A second slot 212 is defined between the inner lateral wall 201 and the second outer lateral wall 205 and corresponding to the second side wall 103 of the male insulator 10. A first recess 213 is defined between the inner lateral wall 201 and the first outer straight wall 207 and corresponding to the first erect wall 105 of the male insulator 10. A second recess 214 is defined between the inner lateral wall 201 and the second outer straight wall 209 and corresponding to the second erect wall 107 of the male insulator 10. The first slot 211, the first recess 213, the second slot 212, and the second recess 214 communicate with one another and cooperatively define a female mating space 215.

Furthermore, a first female guiding block 216 is disposed on a conjunction where the first outer lateral wall 203 and the first outer straight wall 207 are connected. A second female guiding block 217 is disposed on a conjunction where the first outer lateral wall 203 and the second outer straight wall 209 are connected. A third female guiding block 218 is disposed on a conjunction where the second outer lateral wall 205 and the first outer straight wall 207 are connected, and a fourth female guiding block 219 is disposed on conjunction where the second outer lateral wall 205 and the second outer straight wall 209 are connected. The first female guiding block 216 is corresponding to the first male guiding block 111. The second female guiding block 217 is corresponding to the second male guiding block 113. The third female guiding block 218 is corresponding to the third male guiding block 115. The fourth female guiding block 219 is corresponding to the fourth male guiding block 117. In this embodiment, the first female guiding block 216, the second female guiding block 217, the third female guiding block 218, and the fourth female guiding block 219 are trapezoid-shaped structures, as shown in FIG. 5 and FIG. 6. It should be noticed that the structure and the quantity of the guiding block are not limited to those illustrated in figures in this embodiment, and it depends on practical demands.

Figure 8:
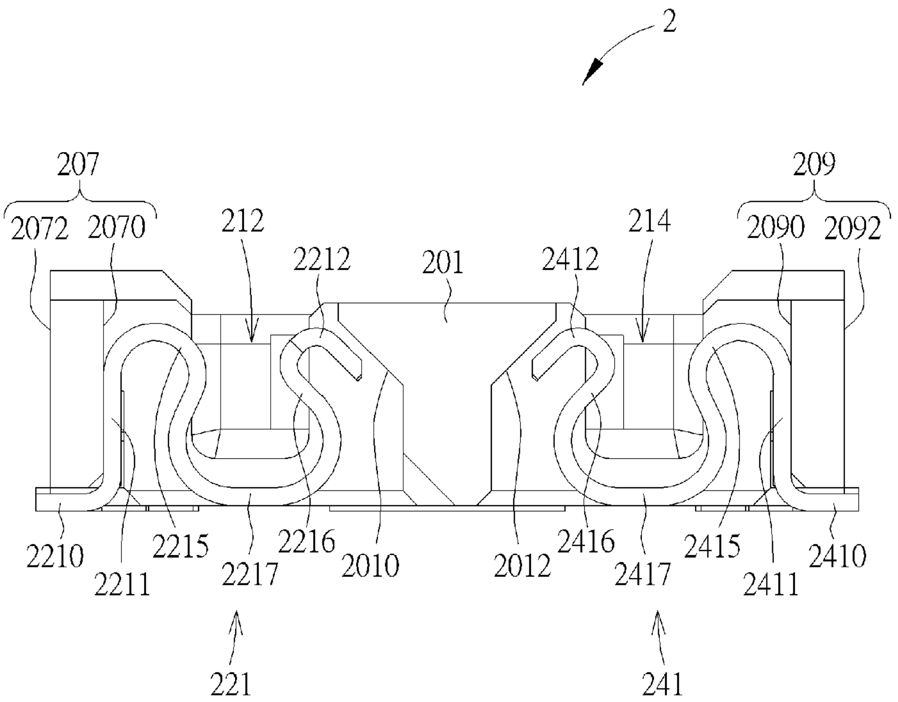
FIG. 8 is a sectional diagram of the female connector according to the embodiment of the present invention.

Please refer to FIG. 6 to FIG. 8. FIG. 8 is a sectional diagram of the female connector 2 according to the embodiment of the present invention. As shown in FIG. 6 to FIG. 8, the first female signal contact set 22 includes three first female signal contacts 221 disposed in the first recess 213. Furthermore, the inner lateral wall 201 includes a first inner surface 2010, a second inner surface 2012, a third inner surface 2014, and a fourth inner surface 2016. The first outer lateral wall 203 includes a first inside surface 2030 and a first outside surface 2032. The second outer lateral wall 205 includes a second inside surface 2050 and a second outside surface 2052. The first outer straight wall 207 includes a first inner erect surface 2070 and a first outer erect surface 2072. The second outer straight wall 209 includes a second inner erect surface 2090 and a second outer erect surface 2092. The first recess 213 is formed between the first inner surface 2010 and the first inner erect surface 2070. The second recess 214 is formed between the second inner surface 2012 and the second inner erect surface 2090. The first slot 211 is formed between the third inner surface 2014 and the first inside surface 2030. The second slot 212 is formed between the fourth inner surface 2016 and the second inside surface 2050.

Each of the first female signal contacts 221 includes a first female welding portion 2210, a first female holding portion 2211, a first female moving portion 2212, a first female opening 2213, a first female notch 2214, a first female resilient arm 2215, a first female clamping arm 2216, and a first female lower connecting portion 2217. The first female welding portion 2210 is welded on another circuit board, not shown in figures. The first female holding portion 2211 is connected to the first female resilient arm 2215 and the first female welding portion 2210, so that the first female resilient arm 2215 extends from the first female welding portion 2210 and protrudes into the first recess 213. The first female holding portion 2211 includes a first female holding stab 2218 embedding into the first outer straight wall 207, so that first female holding portion 2211 is fixed on the first outer straight wall 207. The first female lower connecting portion 2217 is connected to the first female resilient arm 2215 and the first female clamping arm 2216, so that the first female clamping arm 2216 is opposite to the first female resilient arm 2215 and protrudes into the first recess 213. The first female moving portion 2212 extends from an end of the first female clamping arm 2216 away from the first female lower connecting portion 2217 and is movably disposed in the inner lateral wall 201.

In this embodiment, the female lower connecting portion 2217 can be an arc-shaped structure, so that an accommodating space is formed between the first female resilient arm 2215, the first female lower connecting portion 2217, and the first female clamping arm 2216 cooperatively for receiving the first male signal contact 121. However, structure of the first female signal contact 221 is not limited to the figures in this embodiment. Furthermore, the first female opening 2213 is formed on the first female resilient arm 2215. The first female notch 2214 is formed on the first female clamping arm 2216, and the first female notch 2214 does not communicate with the first female opening 2213. The first female opening 2213 is for increasing resilience of the first female resilient arm 2215. The first female notch 2214 is for increasing resilience of the first female clamping arm 2216. Widths and depths of the first female opening 2213 and the first female notch 2214 are adjustable according to practical demands.

Similarly, the second female signal contact set 24 includes three second female signal contacts 241 disposed in the second recess 214. Each of the second female signal contacts 241 includes a second female welding portion 2410, a second female holding portion 2411, a second female moving portion 2412, a second female opening 2413, a second female notch 2414, a second female resilient arm 2415, a second female clamping arm 2416, and a second female lower connecting portion 2417. The second female holding portion 2411 includes a second female holding stab 2418. Structures and operation principles of the second female welding portion 2410, the second female holding portion 2411, the second female moving portion 2412, the second female opening 2413, the second female notch 2414, the second female resilient arm 2415, the second female clamping arm 2416, the second female lower connecting portion 2417, and the second female holding stab 2418 of the second female signal contact 214 are similar to those of the first female welding portion 2210, the first female holding portion 2211, the first female moving portion 2212, the first female opening 2213, the first female notch 2214, the first female resilient arm 2215, the first female clamping arm 2216, the first female lower connecting portion 2217, and the first female holding stab 2218 of the first female signal contact 221, and related descriptions are omitted herein for simplicity.

As shown in FIG. 6 and FIG. 7, the first female holding contact 26 includes a first female holding body 261 and two first embedding claws 263. The quantity of the first embedding claw 263 is not limited thereto. In another embodiment, the first female holding contact 26 can include only one first embedding claw 263. The first female holding body 261 is disposed on the first outer lateral wall 203. Each of the first embedding claws 263 includes a first extending portion 2630, a first bending portion 2632, and a first claw portion 2634. The first extending portion 2630 extends from a side of the first female holding body 261. The first bending portion 2632 extends from the first extending portion 2630. The first claw portion 2634 protrudes from the first bending portion 2632. The first female holding body 261 includes a first plate 2610 and a first edge plate 2612. The first edge plate 2612 extends from the first plate 2610. A first clamping slot 2614 is defined between the first edge plate 2612 and the first plate 2610 for clamping the first outer lateral wall 203. The first extending portions 2630 and the first bending portions 2632 of the two first embedding claws 263 clamp the first outer lateral wall 203, and the first claw portions 2634 embed into the first outer lateral wall 203. As a result, the first female holding contact 26 can be combined with the first outer lateral wall 203 firmly. Furthermore, the first edge plate 2612 has a first female engaging structure 2616. In this embodiment, the first female engaging structure 2616 can be an arc-shaped protruding structure. However, it is not limited to this embodiment.

Similarly, the second female holding contact 28 includes a second female holding body 281 and two second embedding claws 283. The quantity of the second embedding claw 283 is not limited thereto. In another embodiment, the second female holding contact 28 can include only one second embedding claw 283. The second female holding body 281 is disposed on the second outer lateral wall 205. Each of the second embedding claws 283 includes a second extending portion 2830, a second bending portion 2832, and a second claw portion 2834. The second extending portion 2830 extends from a side of the second female holding body 281. The second bending portion 2832 extends from the second extending portion 2830. The second claw portion 2834 protrudes from the second bending portion 2832. The second female holding body 281 includes a second plate 2810 and a second edge plate 2812. The second edge plate 2812 extends from the second plate 2810. A second clamping slot 2814 is defined between the second edge plate 2812 and the second plate 2810 for clamping the second outer lateral wall 205. The second extending portions 2830 and the second bending portions 2832 of the two second embedding claws 283 clamp the second outer lateral wall 205, and the second claw portions 2834 embed into the second outer lateral wall 205. As a result, the second female holding contact 28 can be combined with the second outer lateral wall 205 firmly. Furthermore, the second edge plate 2812 has a second female engaging structure 2816. In this embodiment, the second female engaging structure 2816 can be an arc-shaped protruding structure. However, it is not limited to this embodiment.

Figure 9:
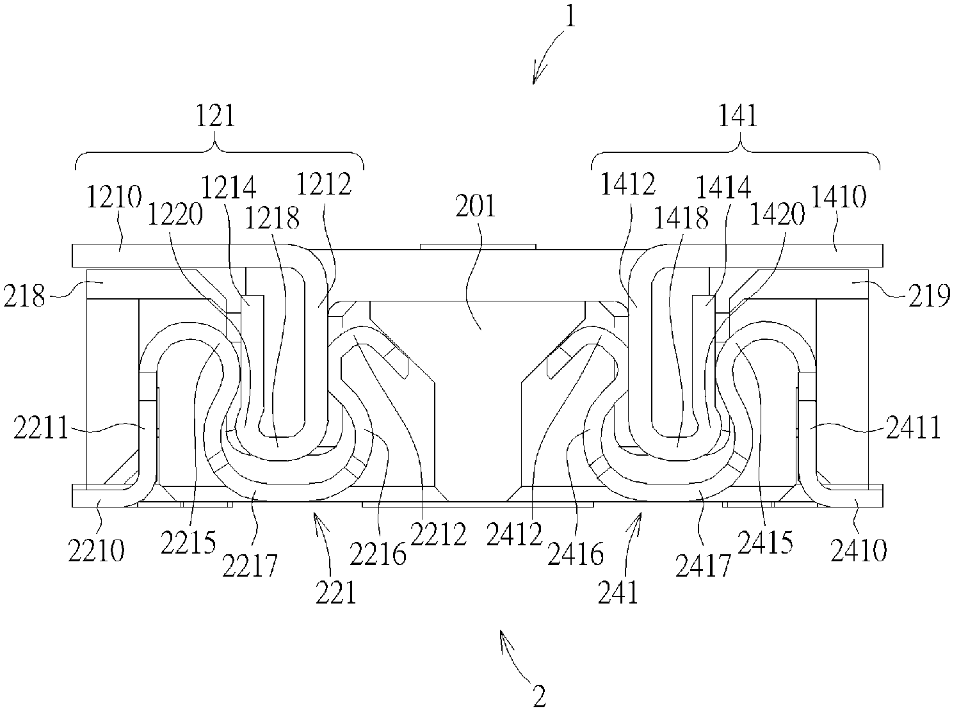
FIG. 9 and FIG. 10 are diagrams illustrating the male connector combined with the female connector at different views according to an embodiment of the present invention.
Figure 10:
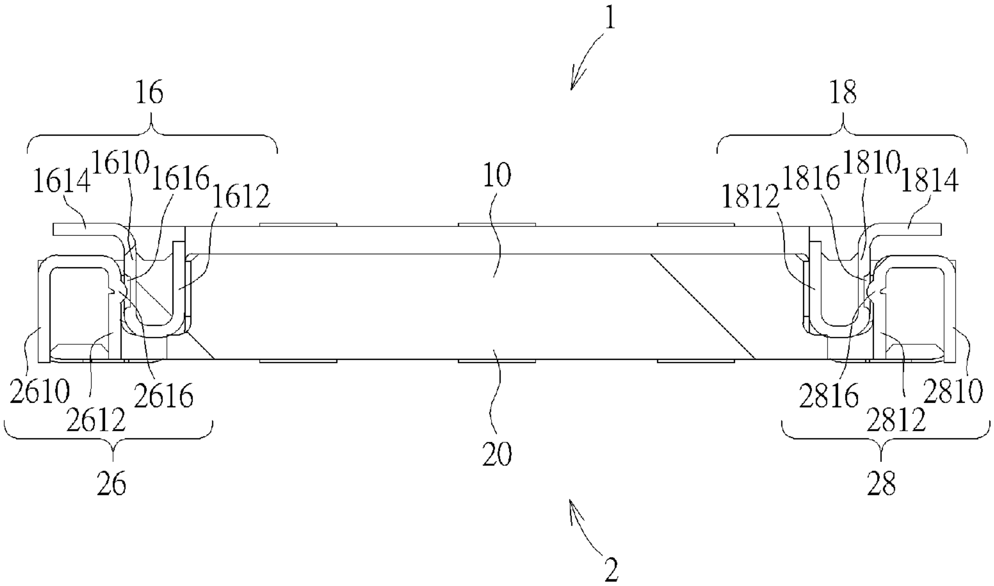

Please refer to FIG. 1, FIG. 2, FIG. 9 and FIG. 10. FIG. 9 and FIG. 10 are diagrams illustrating the male connector 1 combined with the female connector 2 at different views according to an embodiment of the present invention. When it is desired to combine the male connector 1 and the female connector 2, the first female guiding block 216, the second female guiding block 217, the third female guiding block 218, and the fourth female guiding block 219 of the female connector 2 cooperates with the first male guiding block 111, the second male guiding block 113, the third male guiding block 115, and the fourth male guiding block 117 of the male connector 1, respectively, so as to guide the male mating space 109 to be aligned with the inner lateral wall 201 and guide the first side wall 101, the second side wall 103, the first erect wall 105, and the second erect wall 107 of the male connector 1 to be aligned with the first slot 211, the second slot 212, the first recess 213, and the second recess 214 of the female mating space 215 of the female connector 2, respectively. Furthermore, each of the first male signal contacts 121, each of the second male signal contacts 141, the first male holding contact 16, and the second male holding contact 18 are aligned with each of the first female signal contacts 221, each of the second female signal contacts 241, the first female holding contact 26, and the second female holding contact 28, respectively.

When the male connector 1 and the female connector 2 are combined with each other, the first male outer abutting portion 1214 of the first male signal contact 121 abuts against the first female resilient arm 2215, and the first male inner abutting portion 1212 of the first male signal contact 121 contacts with the first female clamping arm 2216. Furthermore, the first female lower connecting portion 2217 and the first male upper connecting portion 1218 are spaced from each other, as shown in FIG. 9. In other words, the first female signal contact 221 merely utilizes the first female clamping arm 2216 and the first female resilient arm 2215 for contacting with the first male inner abutting portion 1212 and the first male outer abutting portion 1214 of the first male signal contact 121, so as to improve a guiding effect and reliability during combination of the first male signal contact 121 and the first female signal contact 221. Similarly, the second male outer abutting portion 1414 of the second male signal contact 141 abuts against the second female resilient arm 2415, and the second male inner abutting portion 1412 of the second male signal contact 141 contacts with the second female clamping arm 2416. Furthermore, the second female lower connecting portion 2417 and the second male upper connecting portion 1418 are spaced from each other, as shown in FIG. 9. In other words, the second female signal contact 241 merely utilizes the second female clamping arm 2416 and the second female resilient arm 2415 for contacting with the second male inner abutting portion 1412 and the second male outer abutting portion 1414 of the second male signal contact 141, so as to enhance guiding effect and reliability during mating of the second male signal contact 141 and the second female signal contact 241.

Furthermore, when the male connector 1 and the female connector 2 are combined with each other, the first male engaging structure 1616 of the first base 1610 engages with the first female engaging structure 2616 of the first edge plate 2612. The second male engaging structure 1816 of the second base 1810 engages with the second female engaging structure 2816 of the second edge plate 2812. Therefore, an additional holding force is generated between the male connector 1 and the female connector 2, which increase an insertion and withdrawal force between the male connector 1 and the female connector 2.

In contrast to the prior art, the gap is formed between the edge of the male outer abutting portion and the upper surface of the male welding portion, and the male lower connecting portion has the exposed Nickel-plated layer. Therefore, when a Surface Mount Technology (SMT) process of the male welding portion is performed, the gap prevents solder from climbing up on the male outer abutting portion via the male welding portion, and the exposed Nickel-plated layer prevents the solder from climbing up on the male inner abutting portion via the male welding portion, which effectively prevents climbing of solder of the male signal contact. Furthermore, the width of the male inner abutting portion and the width of the male outer abutting portion are greater than the width of the male lower connecting portion, so that the contacting area between the male inner abutting portion and the female signal contact or the contacting area between the male outer abutting portion and the female signal contact increases, so as to reduce impedance between the male signal contact and the female signal contact. It allows the male signal contact to endure a larger current. Besides, when the male connector and the female connector are mated with each other, the first male engaging structure engages with the first female engaging structure, and the second male engaging structure engages with the second female engaging structure. It increases a mating force and enhances reliability. In addition, the male holding contact is fixed on the male connector by the engaging slot and the embedding wing, and the female holding contact is fixed on the female connector by the clamping slot and the embedding claw. Therefore, it provides an additional holding force when the male connector is mated with the female connector, and achieves better effects of positioning and holding.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A board to board male connector, comprising:

a male insulator comprising a first side wall, a second side wall, a first erect wall, and a second erect wall, the first side wall being opposite to the second side wall, and the first erect wall being opposite to the second erect wall;

a first male signal contact set disposed on the first erect wall;

a second male signal contact set disposed on the second erect wall; and a first male holding contact comprising:

a first male holding body disposed on the first side wall; and at least one first embedding wing extending from at least one side of the first male holding body and embedding into the first side wall, the at least one first embedding wing being partially hidden inside the first side wall and partially exposed out of the first side wall.

2. The male connector of claim 1, wherein the first male holding body comprises a first base and a first engaging plate, the first base comprises a first male engaging structure, the first engaging plate extends from the first base, a first engaging slot is defined between the first engaging plate and the first base and for engaging with the first side wall, and the first male holding contact further comprises a first holding welding portion extending from the first base and being welded on a circuit board.

3. The male connector of claim 1, further comprising a second male holding contact, the second male holding contact comprising:

a second male holding body disposed on the second side wall; and at least one second embedding wing extending from the second male holding body, the at least one second embedding wing embedding into the second side wall for fixing the second male holding body onto the second side wall.

4. The male connector of claim 3, wherein the second male holding body comprises a second base and a second engaging plate, the second base comprises a second male engaging structure, the second engaging plate extends from the second base, a second engaging slot is defined between the second engaging plate and the second base and for engaging with the second side wall, and the second male holding contact further comprises a second holding welding portion extending from the second base and being welded on a circuit board.

5. The male connector of claim 1, wherein the first erect wall has a first upper side, a first lower side, a first inner side, and a first outer side, the second erect wall has a second upper side, a second lower side, a second inner side, and a second outer side, the first lower side and the second lower side face a circuit board, the first inner side faces the second inner side, the first male signal contact set comprises a plurality of first male signal contacts, and each of the plurality of first male signal contacts comprises:

a first male welding portion welded on the circuit board;

a first male inner abutting portion extending from the first male welding portion and being combined with the first inner side; and a first male outer abutting portion extending from the first male inner abutting portion and being combined with the first outer side, a gap being formed between an edge of the first male outer abutting portion and an upper surface of the first male welding portion, a width of the first male inner abutting portion and a width of the first male outer abutting portion being greater than a width of the first male welding portion.

6. The male connector of claim 5, wherein each of the plurality of first male signal contacts further comprising:

a first male lower connecting portion connected to the first male welding portion and the first male inner abutting portion, the first male lower connecting portion having an exposed Nickel-plated layer;

a first male upper connecting portion extending from the first male inner abutting portion and being combined with the first upper side; and a first male bending portion connected to the first male upper connecting portion and the first male outer abutting portion, the first male bending portion being an arc-shaped structure, the first male bending portion protruding from the first male outer abutting portion along a direction from the first male inner abutting portion toward the first male outer abutting portion.

7. The male connector of claim 5, wherein the second male signal contact set comprises a plurality of second male signal contacts, and each of the plurality of second male signal contacts comprises:

a second male welding portion welded on the circuit board;

a second male inner abutting portion extending from the second male welding portion and being combined with the second inner side; and a second male outer abutting portion extending from the second male inner abutting portion and being combined with the second outer side, a gap being formed between an edge of the second male outer abutting portion and an upper surface of the second male welding portion, a width of the second male inner abutting portion and a width of the second male outer abutting portion being greater than a width of the second male welding portion.

8. The male connector of claim 7, wherein each of the plurality of second male signal contacts further comprising:

a second male lower connecting portion connected to the second male welding portion and the second male inner abutting portion, the second male lower connecting portion having an exposed Nickel-plated layer;

a second male upper connecting portion extending from the second male inner abutting portion and being combined with the second upper side; and a second male bending portion connected to the second male upper connecting portion and the second male outer abutting portion, the second male bending portion being an arc-shaped structure, the second male bending portion protruding from the second male outer abutting portion along a direction from the second male inner abutting portion.

9. The male connector of claim 1, wherein the first side wall, the first erect wall, the second side wall, and the second erect wall communicate with one another and cooperatively define a male mating space, a first male guiding block is disposed at a conjunction where the first side wall and the first erect wall are connected, a second male guiding block is disposed at a conjunction where the first side wall and the second erect wall are connected, a third male guiding block is disposed at a conjunction where the second side wall and the first erect wall are connected, and a fourth male guiding block is disposed at a conjunction where the second side wall and the second erect wall are connected.

10. A board to board female connector, comprising:

a female insulator comprising an inner lateral wall, a first outer lateral wall, a second outer lateral wall, a first outer straight wall, and a second outer straight wall, a first slot being defined between the inner lateral wall and the first outer lateral wall, a second slot being defined between the inner lateral wall and the second outer lateral wall, a first recess being defined between the inner lateral wall and the first outer straight wall, and a second recess being defined between the inner lateral wall and the second outer straight wall;

a first female signal contact set disposed in the first recess;

a second female signal contact set disposed in the second recess; and a first female holding contact comprising:

a first female holding body disposed on the first outer lateral wall; and at least one first embedding claw comprising a first extending portion, a first bending portion, and a first claw portion, the first extending portion extending from a side of the first female holding body, the first bending portion extending from the first extending portion, the first claw portion protruding from the first bending portion, the first extending portion and the first bending portion clamping the first outer lateral wall, and the first claw portion embedding into the first outer lateral wall.

11. The female connector of claim 10, wherein the first female holding body comprises a first plate and a first edge plate, the first edge plate comprises a first female engaging structure, the first edge plate extends from the first plate, a first clamping slot is defined between the first edge plate and the first plate for clamping the first outer lateral wall.

12. The female connector of claim 10, further comprising a second female holding contact, the second female holding contact comprising:

a second female holding body disposed on the second outer lateral wall; and at least one second embedding claw comprising a second extending portion, a second bending portion, and a second claw portion, the second extending portion extending from a side of the second female holding body, the second bending portion extending from the second extending portion, the second claw portion protruding from the second bending portion, the second extending portion and the second bending portion clamping the second outer lateral wall, and the second claw portion embedding into the second outer lateral wall.

13. The female connector of claim 12, wherein the second female holding body comprises a second plate and a second edge plate, the second edge plate comprises a second female engaging structure, the second edge plate extends from the second plate, a second clamping slot is defined between the second edge plate and the second plate for clamping the second outer lateral wall.

14. The female connector of claim 10, wherein the inner lateral wall comprises a first inner surface, a second inner surface, a third inner surface, and a fourth inner surface, the first outer lateral wall comprises a first inside surface and a first outside surface, the second outer lateral wall comprises a second inside surface and a second outside surface, the first outer straight wall comprises a first inner erect surface and a first outer erect surface, the second outer straight wall comprises a second inner erect surface and a second outer erect surface, the first recess is formed between the first inner surface and the first inner erect surface, the second recess is formed between the second inner surface and the second inner erect surface, the first slot is formed between the third inner surface and the first inside surface, the second slot is formed between the fourth inner surface and the second inside surface, the first female signal contact set comprises a plurality of first female signal contacts, each of the plurality of first female signal contacts comprises:

a first female welding portion welded on a circuit board;

a first female resilient arm extending from the first female welding portion and protruding into the first recess; and a first female clamping arm opposite to the first female resilient arm and protruding into the first recess.

15. The female connector of claim 14, wherein each of the plurality of first female signal contacts further comprises:

a first female holding portion connected to the first female resilient arm and the first female welding portion, the first female holding portion comprising a first female holding stab embedding into the first outer straight wall;

a first female lower connecting portion connected to the first female resilient arm and the first female clamping arm; and a first female moving portion extending from an end of the first female clamping arm away from the first female lower connecting portion, the first female moving portion being movably disposed in the inner lateral wall.

16. The female connector of claim 14, wherein each of the plurality of first female signal contacts further comprises:

a first female opening formed on the first female resilient arm; and a first female notch formed on the first female clamping arm, the first female notch not communicates with the first female opening.

17. The female connector of claim 14, wherein the second female signal contact set comprises a plurality of second female signal contacts, each of the plurality of second female signal contacts comprises:

a second female welding portion welded on the circuit board;

a second female resilient arm extending from the second female welding portion and protruding into the second recess; and a second female clamping arm opposite to the second female resilient arm and protruding into the second recess.

18. The female connector of claim 17, wherein each of the plurality of second female signal contacts further comprises:

a second female holding portion connected to the second female resilient arm and the second female welding portion, the second female holding portion comprising a second female holding stab embedding into the second outer straight wall;

a second female lower connecting portion connected to the second female resilient arm and the second female clamping arm; and a second female moving portion extending from an end of the second female clamping arm away from the second female lower connecting portion, the second female moving portion being movably disposed in the inner lateral wall.

19. The female connector of claim 17, wherein each of the plurality of second female signal contacts further comprises:

a second female opening formed on the second female resilient arm; and a second female notch formed on the second female clamping arm, the second female notch not communicates with the second female opening.

20. The female connector of claim 10, wherein the first slot, the first recess, the second slot, and the second recess communicate with one another and cooperatively define a female mating space, a first female guiding block is disposed on a conjunction where the first outer lateral wall and the first outer straight wall are connected, a second female guiding block is disposed on a conjunction where the first outer lateral wall and the second outer straight wall are connected, a third female guiding block is disposed on a conjunction where the second outer lateral wall and the first outer straight wall are connected, and a fourth female guiding block is disposed on conjunction where the second outer lateral wall and the second outer straight wall are connected.

* * * * *